United States Patent
Lee et al.

(10) Patent No.: US 9,478,684 B2
(45) Date of Patent: Oct. 25, 2016

(54) THREE-LAYER CORE-SHELL NANOPARTICLES FOR MANUFACTURING SOLAR CELL LIGHT ABSORPTION LAYER AND METHOD OF MANUFACTURING THE SAME

(71) Applicant: LG CHEM, LTD., Seoul (KR)

(72) Inventors: Hosub Lee, Daejeon (KR); Seokhee Yoon, Daejeon (KR); Seokhyun Yoon, Daejeon (KR); Eun Ju Park, Daejeon (KR)

(73) Assignee: LG CHEM, LTD., Seoul (KP)

( * ) Notice: Subject to any disclaimer, the term of this patent is extended or adjusted under 35 U.S.C. 154(b) by 0 days.

(21) Appl. No.: 14/898,473

(22) PCT Filed: Aug. 1, 2014

(86) PCT No.: PCT/KR2014/007091
§ 371 (c)(1),
(2) Date: Dec. 14, 2015

(87) PCT Pub. No.: WO2015/016650
PCT Pub. Date: Feb. 5, 2015

(65) Prior Publication Data
US 2016/0133766 A1 May 12, 2016

(30) Foreign Application Priority Data
Aug. 1, 2013 (KR) .................. 10-2013-0091770

(51) Int. Cl.
H01L 31/032 (2006.01)
H01L 31/0352 (2006.01)
H01L 31/18 (2006.01)

(52) U.S. Cl.
CPC ....... *H01L 31/0324* (2013.01); *H01L 31/0326* (2013.01); *H01L 31/035281* (2013.01); *H01L 31/18* (2013.01); *Y02E 10/50* (2013.01)

(58) Field of Classification Search
CPC ........... H01L 31/0324; H01L 31/0326; H01L 31/035281; H01L 31/18; Y02E 10/50
USPC .............................. 428/403; 438/95; 136/255
See application file for complete search history.

(56) References Cited

U.S. PATENT DOCUMENTS

| 2006/0228551 | A1 | 10/2006 | Chen et al. |
| 2008/0280030 | A1* | 11/2008 | Van Duren ....... H01L 31/03928 427/74 |
| 2011/0097496 | A1 | 4/2011 | Mitzi et al. |
| 2011/0294254 | A1* | 12/2011 | Jackrel ............. H01L 31/0322 438/95 |
| 2012/0100660 | A1* | 4/2012 | Hagedorn ............. C25D 5/48 438/63 |

FOREIGN PATENT DOCUMENTS

| CN | 103055774 A | 4/2013 |
| KR | 10-2011-0075227 A | 7/2011 |
| WO | WO 2007/134843 A2 | 11/2007 |
| WO | WO 2011/065994 A2 | 6/2011 |
| WO | WO2012-037276 * | 3/2012 |
| WO | WO 2012/037276 A1 | 3/2012 |
| WO | WO2012-112821 * | 8/2012 |
| WO | WO 2012/112821 A1 | 8/2012 |
| WO | WO 2013/042966 A1 | 3/2013 |

OTHER PUBLICATIONS

Qijie Guo et al., "Synthesis of $Cu_2ZnSnS_4$ Nanocrystal Ink and Its Use for Solar Cells", Journal of the American Chemical Society, 2009, pp. 11672-11673, vol. 131, No. 33, American Chemical Society.
Tooru Tanaka et al., "Fabrication of $Cu_2ZnSnS_4$ thin films by co-evaporation", Physica Status Solidi (C), 2006, pp. 2844-2847, vol. 3, No. 8, Wiley-VCH Verlag GmbH & Co. KGaA, Weinheim.
Martin A. Green et al., "Solar cell efficiency tables (version 37)", Progress in Photovoltaics: Research and Applications, 2011, pp. 84-92, vol. 19, John Wiley & Sons, Ltd.
International Search Report for PCT/KR2014/007091 filed Aug. 1, 2014.

* cited by examiner

*Primary Examiner* — Leszek Kiliman

(57) ABSTRACT

Disclosed are three-layer core-shell structure nanoparticles used to form a light absorption layer of solar cells including a core including a copper (Cu)-containing chalcogenide, and (i) a first shell including a tin (Sn)-containing chalcogenide and a second shell including a zinc (Zn)-containing chalcogenide; or (ii) a first shell including a zinc (Zn)-containing chalcogenide and a second shell including a tin (Sn)-containing chalcogenide, and a method of manufacturing the same.

20 Claims, 12 Drawing Sheets

FIG. 1A
FIG. 1B
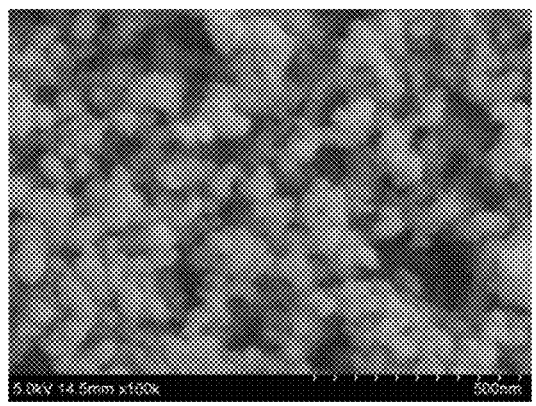
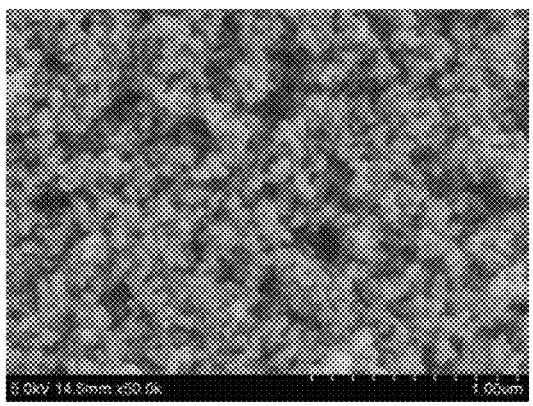
FIG. 1C
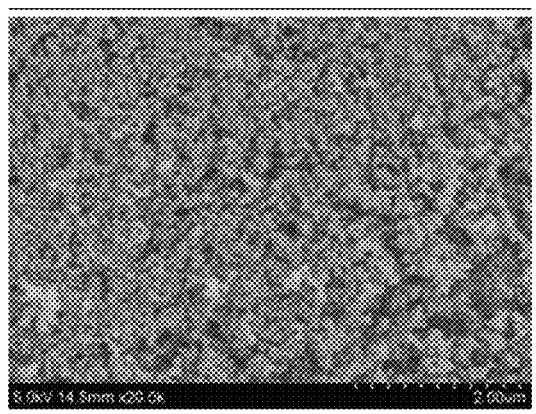

FIG. 6A
FIG. 6B
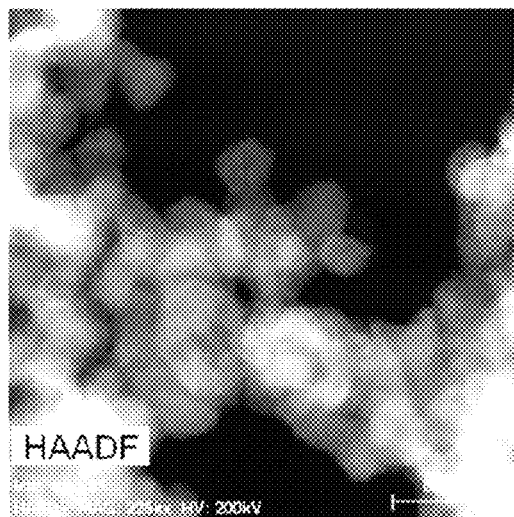
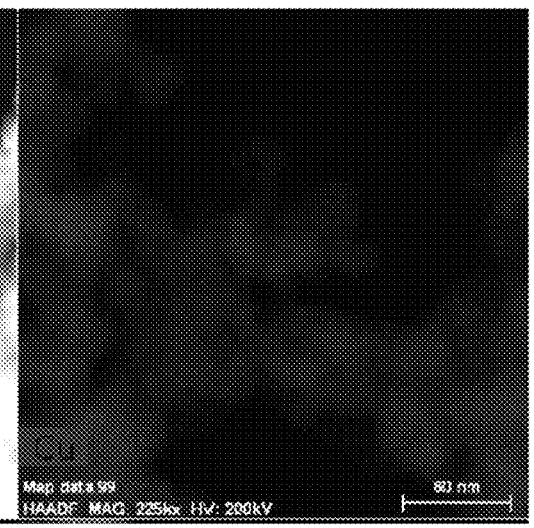
FIG. 6C
FIG. 6D
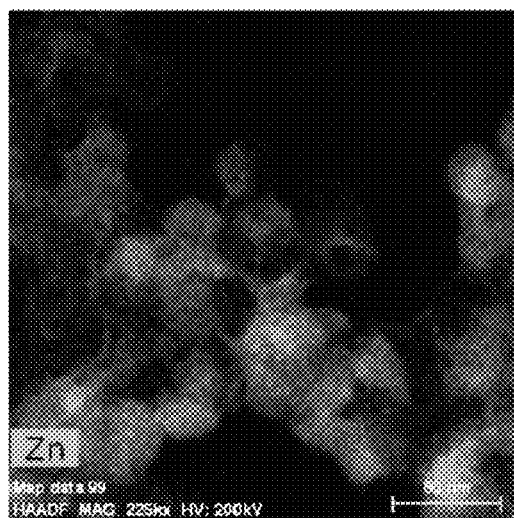
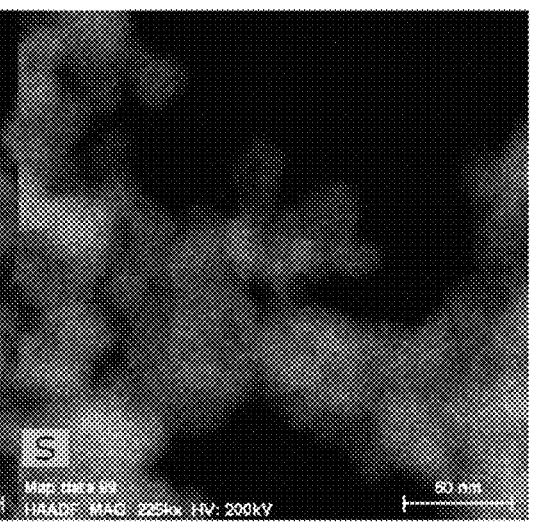

FIG. 7A
FIG. 7B
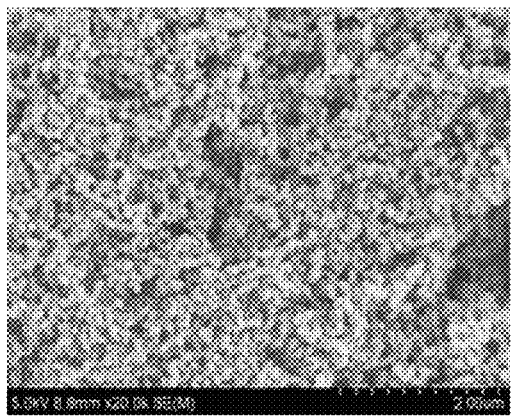
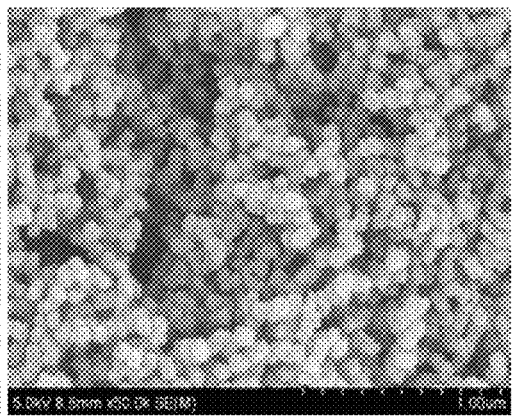
FIG. 7C
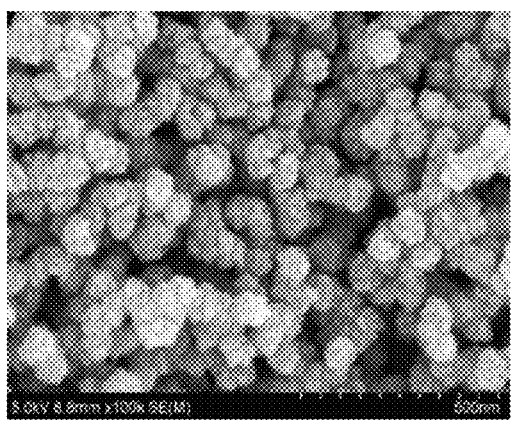

THREE-LAYER CORE-SHELL NANOPARTICLES FOR MANUFACTURING SOLAR CELL LIGHT ABSORPTION LAYER AND METHOD OF MANUFACTURING THE SAME

CROSS-REFERENCE TO RELATED APPLICATIONS

The present application is a National Stage of International Patent Application No. PCT/KR2014/007091 filed on Aug. 1, 2014, which claims priority to Korean Patent Application No. KR 10-2013-0091770 filed on Aug. 1, 2013, the disclosures of which are hereby incorporated in their entirety by reference.

TECHNICAL FIELD

The present invention relates to three-layer core-shell nanoparticles for manufacturing a solar cell light absorption layer and a method of manufacturing the same.

BACKGROUND ART

Solar cells have been manufactured using a light absorption layer formed at high cost and silicon (Si) as a semiconductor material since an early stage of development. To more economically manufacture commercially viable solar cells, structures of thin film solar cells, using an inexpensive light absorbing material such as copper indium gallium sulfo (di)selenide (CIGS) or $Cu(In, Ga)(S, Se)_2$, have been developed. Such CIGS-based solar cells typically include a rear electrode layer, an n-type junction part, and a p-type light absorption layer. Solar cells including such CIGS layers have a power conversion efficiency of greater than 19%. However, in spite of potential for CIGS-based thin film solar cells, costs and insufficient supply of In are main obstacles to widespread commercial application of thin film solar cells using CIGS-based light absorption layers. Thus, there is an urgent need to develop solar cells using In-free or low-cost universal elements.

Accordingly, as an alternative to the CIGS-based light absorption layer, $CZTS(Cu_2ZnSn(S,Se)_4)$-based solar cells including copper (Cu), zinc (Zn), tin (Sn), sulfur (S), or selenium (Se), which are extremely cheap elements, have recently received attention. CZTS has a direct band gap of about 1.0 eV to about 1.5 eV and an absorption coefficient of $10^4$ cm$^{-1}$ or more, reserves thereof are relatively high, and CZTS uses Sn and Zn, which are inexpensive.

In 1996, CZTS hetero junction PV batteries were reported for the first time, but CZTS-based solar cells have been less advanced than CIGS-based solar cells and photoelectric efficiency of CZTS-based solar cells is 10% or less, much lower than that of CIGS-based solar cells. Thin films of CZTS are manufactured by sputtering, hybrid sputtering, pulsed laser deposition, spray pyrolysis, electro-deposition/thermal sulfurization, e-beam processing, Cu/Zn/Sn/thermal sulfurization, and a sol-gel method.

With regard to fabrication methods, WO2007-134843 discloses a method of forming a CZTS layer by simultaneously or sequentially stacking Cu, Zn, and Sn via vacuum sputtering and heat-treating the resulting material under an S or Se atmosphere. Some papers ((Phys. Stat. Sol. C. 2006, 3, 2844 and Prog. Photovolt: Res. Appl. 2011; 19:93-96) disclose a method of forming a CZTS layer by simultaneously depositing Cu, Zn, Sn, S, or Se on a base by simultaneous vacuum evaporation. However, the above-described related art is advantageous in that deposition is performed in a relatively well-controlled state, but is disadvantageous in that manufacturing costs are high due to use of expensive equipment.

Meanwhile, PCT/US/2010-035792 discloses formation of a thin film through heat treatment of ink including CZTS/Se nanoparticles on a base. With regard to methods of forming CZTS precursor particles, Journal, J. Am. Chem. Soc., 2009, 131, 11672 discloses that CZTS nanoparticles are formed by mixing a solution including Cu, Sn and Zn precursors and a solution including S or Se at high temperature through hot injection. In addition, US2011-0097496 discloses a method of forming a CZTS layer using a precursor for forming the CZTS layer, prepared by dissolving Cu, Zn, Sn salts together with an excess of S or Se in hydrazine, through heat treatment and selenization in subsequent processes. However, the hot injection has a problem regarding stability. In addition, hydrazine including a chalcogen compound containing an excess of S or Se is a highly toxic, highly reactive, highly explosive solvent and thus a solution process using hydrazine entails high risk. Furthermore, hydrazine is difficult to handle and thus there are difficulties in manufacturing processes.

Therefore, there is a high need to develop a technology for thin film solar cells including a high efficiency light absorption layer and being stable against oxidation using a fabrication method that is less expensive and safer than an existing CZTS layer preparation method.

DISCLOSURE

Technical Problem

Therefore, the present invention has been made to solve the above and other technical problems that have yet to be resolved.

As a result of a variety of intensive studies and various experiments, the inventors of the present invention confirmed that, when a light absorption layer is manufactured using three-layer core-shell structure nanoparticles including a core including a copper (Cu)-containing chalcogenide, and (i) a first shell including a tin (Sn)-containing chalcogenide and a second shell including a zinc (Zn)-containing chalcogenide; or (ii) a first shell including a zinc (Zn)-containing chalcogenide and a second shell including a tin (Sn)-containing chalcogenide, productivity may be enhanced due to inexpensive and safe manufacturing processes, the composition of a thin film is entirely uniform, a thin film that is resistant to oxidation may be provided and photoelectric efficiency may be improved due to growth of a light absorption layer for CZTS based solar cells having high density, thus completing the present invention.

Technical Solution

In accordance with one aspect of the present invention, provided are three-layer core-shell structure nanoparticles forming a light absorption layer of solar cells including a core including a copper (Cu)-containing chalcogenide, and (i) a first shell including a tin (Sn)-containing chalcogenide and a second shell including a zinc (Zn)-containing chalcogenide; or (ii) a first shell including a zinc (Zn)-containing chalcogenide and a second shell including a tin (Sn)-containing chalcogenide .

Here, the 'core' means particles primarily synthesized as materials mainly located at the center of nanoparticles having various compositions. The 'shell' means particles, which are different from particles constituting a core and surround a partial or entire surface of a core, in surface portions distinguished from the core. Namely, the 'shell' means particles surrounding a partial surface or an entire surface of a core. Core-shell structure particles synthesized as described above include two particle types, each of which constitutes a shell existing around a core in a microscopic area of several hundred nanometers and, as such, a composition ratio of three elements required for formation of a light absorption layer may be easily controlled.

In addition, the 'chalcogenide' means a Group VI element, for example, a material including sulfur (S) and/or selenium (Se).

In a specific embodiment, the copper (Cu)-containing chalcogenide may be at least one selected from the group consisting of CuS, CuS wherein 1.7≤x≤2.0, CuSe and $Cu_ySe$ wherein 1.7≤y≤2.0, particularly at least one selected from the group consisting of $Cu_2S$, CuS, $Cu_2Se$ and CuSe, more particularly CuS and/or CuSe.

In addition, the tin (Sn)-containing chalcogenide may be SnS, and/or SnSe, and the zinc (Zn)-containing chalcogenide may be ZnS, and/or ZnSe.

Generally, when a CZTS thin film is formed using CZTS crystal type nanoparticles, previously formed crystals are small and, as such, it is difficult to enlarge the sizes of crystals at a subsequent thin film manufacturing process. As a result, each grain is small and thereby interfaces are enlarged, and, accordingly, electron loss occurs at the interfaces, resulting in deterioration of efficiency.

Compared with the above, when a CZTS thin film is formed of Cu, Zn and Sn, which are not a CZTS crystal type and exist separately, through a second phase, each element is rearranged during a thin film formation procedure while crystals grow and, and, as such, film density and crystal sizes may be improved.

Therefore, nanoparticles used in a thin film have to include Cu, Zn and Sn, and must not be a CZTS crystal type. However, metal nanoparticles consisting of only one metal element may be easily oxidized and require an oxygen removal process using a large amount of Se and high temperature.

As a result of intensive studies, the inventors of the present invention confirmed that, when nanoparticles in which metal and a chalcogenide are combined are used, a chalcogenide element is properly provided in a high temperature process to form a CZTS thin film and, as such, oxidization may be prevented.

Furthermore, when one nano particle includes all of Cu, Zn and Sn, a uniform composition may be obtained, compared to various types of nanoparticles including each element. Namely, in case of a core-shell structure, ratios of Cu, Zn and Sn in particles may be easily controlled by controlling ratios of materials constituting a core and shells. Therefore, a composition ratio of a final CZTS thin film may be easily controlled and thereby, a CZTS thin film having a variety of composition ratios may be formed.

Meanwhile, in regard to a structure, ionization tendencies of Cu, Zn and Sn are different and thereby it is difficult to manufacture nanoparticles having a three-layer core-shell structure arranged sequentially and not having the structure according to the present invention. In addition, the sequentially arranged three-layer core-shell structure nanoparticles do not have especial advantages. For example, when a Cu salt is used to manufacture a copper (Cu)-containing chalcogenide shell for core particles of a zinc (Zn)-containing chalcogenide, some Zn of a zinc (Zn)-containing chalcogenide is ionized while Cu is easily reduced during a manufacturing process of core-shell structure nanoparticles due to different ionization tendencies between Zn and Cu. Thus, a zinc (Zn)-containing chalcogenide core and a copper (Cu)-containing chalcogenide shell are not clearly formed and particles including Cu, Zn and the like non-uniformly distributed may be easily formed. In addition, some of ionized Zn binds with oxygen and, as such, oxides may be generated.

In a specific embodiment, the diameter of the core may be 20 nanometers to 200 nanometers. Outside this range, when the size of a core including a copper (Cu)-containing chalcogenide is too large, the sizes of core-shell structure nanoparticles including formed shells are greatly enlarged and, as such, pores among particles in a final thin film having a thickness of 1 micrometers to 2 micrometers are enlarged. On the contrary, when the diameter of a core is too small, particles may be easily condensed. In addition, it is difficult to obtain shells surrounding a surface of a core such that a final thin film has a proper composition ratio.

Meanwhile, the weights of the first shell and second shell are controlled by reaction time, reaction temperature and concentration of reactant when a first shell or a second shell is formed on the surface after forming a core and then forming a first shell. The amount of the zinc chalcogenide included in a material constituting shells formed by controlling the reaction time, reaction temperature and concentration of reactant is preferably 35 parts by weight to 100 parts by weight based on 100 parts by weight of a copper chalcogenide forming a core. Meanwhile, the amount of the tin chalcogenide is preferably 40 parts by weight to 65 parts by weight based on 100 parts by weight of the copper chalcogenide.

In particular, the amounts of the first shell and second shell are preferably determined considering desired the entire composition ratio of a CZTS thin film and a composition ratio with respect to a core. Generally, a composition ratio of a CZTS thin film is follows: Cu:Zn:Sn=1.5~2.5: 0.9~1.5:1. Therefore, when a CZTS thin film is formed by mixing metal nanoparticles, three-layer core-shell structure nanoparticles may have a composition ratio as follows: Cu:Zn=0.3~1.3:0.9~1.5. Accordingly, when the diameter of a core is 20 nanometers to 200 nanometers, a first shell and second shell may include materials in the above range.

The present invention also provides a method of manufacturing three-layer core-shell structure nanoparticles, the method including:

(i) preparing a first solution including at least one Group VI source selected from the group consisting of compounds including sulfur (S), or selenium (Se), or sulfur (S) and selenium (Se);

(ii) preparing a second solution including a copper (Cu) salt, a third solution including a tin (Sn) salt and a fourth solution including a zinc (Zn) salt;

(iii) manufacturing and reacting a mixture by mixing the first solution and second solution to synthesis a copper (Cu)-containing chalcogenide core particles;

(iv) mixing the third solution or fourth solution with a product including the core particles of step (iii) to form a first shell; and (v) forming a second shell by mixing the fourth solution or third solution with a product including core-shell structure nanoparticles in which the first shell of step (iv) is formed to synthesize three-layer core-shell structure nanoparticles and then purifying.

In a specific embodiment, solvents of the first solution to fourth solution each independently may be at least one selected from the group consisting of water, methanol, ethanol, glycol class solvents, oleylamine, dimethyl sulfoxide and dimethyl formamide.

The glycol class solvents, which are not limited specifically, may be at least one selected from the group consisting of, for example, ethylene glycol, diethylene glycol, NMP, diethylene glycol mono ethyl ether (DEGMEE) and triethylene glycol.

As described above, a method of manufacturing the three-layer core-shell structure nanoparticles according to the present invention consists of a solution process and thereby process costs may be reduced and toxic materials are not used in a solution preparation process. In addition, the amount of a capping agent used may be reduced and, as such, when a CZTS thin film is formed, carbon residues may be reduced.

In a specific embodiment, the Group VI source included in the first solution may be at least one selected from the group consisting of Se, $Na_2Se$, $K_2Se$, $Ca_2Se$, $(CH_3)_2Se$, $SeO2$, $SeCl_4$, $H_2SeO_3$, $Na_2S$, $K_2S$, $Ca_2S$, $(CH_3)_2S$, $H_2SO_4$, S, $Na_2S_2O_3$, $NH_2SO_3H$ and hydrates thereof, or may be at least one selected from the group consisting of thiourea, thioacetamide and selenourea as organic matters.

In a specific embodiment, salts included in the second solution, third solution and fourth solution may be at least one selected from the group consisting of chlorides, nitrates, nitrites, sulfates, acetates, sulfites, acetylacetonates and hydroxides. The tin (Sn) salt is not limited to a divalent salt or tetravalent salt and may use all salt types.

Meanwhile, when the second solution is mixed with the first solution in step (iii), the Group VI source may be included in an amount of 0.5 mol or more, particularly a desired composition ratio in a range of 0.5 mol to 4 mol, based on 1 mol of a copper (Cu) salt.

Outside the above range, when the Group VI source is included in a amount of less than 0.5 mol, sufficient supply of the Group VI element is impossible and thereby stable phases such as CuS(Se) or $Cu_2S(Se)$ are not formed, and, accordingly, phases may be changed or separated metals may be oxidized at subsequent processes.

In addition, when the Group VI source is included in an amount of greater than 4 mol, generation of an undesired Group VI element is increased and the Group VI source is evaporated in a heat treatment process to manufacture a thin film, and, as such, pores may be excessively generated in a final thin film.

In particular, to the first shell on a surface of the copper (Cu)-containing chalcogenide particles, the copper (Cu)-containing chalcogenide particles may be mixed with the third solution including the tin (Sn) salt and the fourth solution including the zinc (Zn) salt.

In the mixing process, the amounts of the tin (Sn)-containing chalcogenide and the zinc (Zn)-containing chalcogenide included in materials constituting shells may be determined according to the concentrations of the tin (Sn) salt or zinc (Zn) salt. Therefore, to synthesize three-layer structure particles having the above ratio, the concentration of the tin (Sn) salt constituting the first shell may be determined such that a molar ratio of tin (Sn)/copper (Cu) is in a range of 0.5 to 3 and the concentration of the zinc (Zn) salt constituting the first shell may be determined such that a molar ratio of zinc (Zn)/copper (Cu) is in a range of 0.6 to 3.

In addition, each of the first shell and second shell may include the tin (Sn)-containing chalcogenide or the zinc (Zn)-containing chalcogenide. When the first shell includes the tin (Sn)-containing chalcogenide, the second shell includes the zinc (Zn)-containing chalcogenide. To synthesis three-layer particles having the above composition ratio, the concentration of the zinc (Zn) salt constituting the second shell may be determined such that a molar ratio of zinc (Zn)/copper (Cu) is in a range of 0.6 to 3. When the first shell includes the zinc (Zn)-containing chalcogenide, the concentration of the tin (Sn) salt constituting the second shell may be determined such that a molar ratio of tin (Sn)/copper (Cu) is in a range of 0.5 to 3.

In a specific embodiment, when the third solution or fourth solution is mixed, to resolve a problem due to deficiency of a Group VI element in a subsequent CZTS layer formation process, the Group VI source may be further added to the third solution or fourth solution. Here, the amount of the added Group VI source may be determined considering the amount of a Group VI element remaining in each process.

Meanwhile, the inventors of the present application confirmed that, when a thin film is manufactured with the three-layer core-shell structure nanoparticles as described above, a superior quality thin film may be provided and a thin film having an entirely uniform composition may be obtained.

Accordingly, the present invention provides a thin film including the light absorption layer based on the three-layer core-shell structure nanoparticles.

A method of manufacturing the thin film according to the present invention includes:

(i) dispersing three-layer core-shell structure nanoparticles in a solvent to manufacture an ink composition;

(ii) coating the ink on a base provided with an electrode; and (iii) drying and then heat-treating the ink coated on the base provided with an electrode.

The nanoparticles of step (i) have, preferably, a diameter of 25 to 300 nanometers. The solvent of step (i) is not particularly limited so long as the solvent is a general organic solvent and may be one organic solvent selected from among alkanes, alkenes, alkynes, aromatics, ketones, nitriles, ethers, esters, organic halides, alcohols, amines, thiols, carboxylic acids, phosphines, phosphites, phosphates, sulfoxides, and amides or a mixture of at least one organic solvent selected therefrom.

In particular, the alcohols may be at least one mixed solvent selected from among ethanol, 1-propanol, 2-propanol, 1-pentanol, 2-pentanol, 1-hexanol, 2-hexanol, 3-hexanol, heptanol, octanol, ethylene glycol (EG), diethylene glycol monoethyl ether (DEGMEE), ethylene glycol monomethyl ether (EGMME), ethylene glycol monoethyl ether (EGMEE), ethylene glycol dimethyl ether (EGDME), ethylene glycol diethyl ether (EGDEE), ethylene glycol monopropyl ether (EGMPE), ethylene glycol monobutyl ether (EGMBE), 2-methyl-1-propanol, cyclopentanol, cyclohexanol, propylene glycol propyl ether (PGPE), diethylene glycol dimethyl ether (DEGDME), 1,2-propanediol (1,2-PD), 1,3-propanediol (1,3-PD), 1,4-butanediol (1,4-BD), 1,3-butanediol (1,3-BD), α-terpineol, diethylene glycol (DEG), glycerol, 2-(ethylamino)ethanol, 2-(methylamino)ethanol, and 2-amino-2-methyl-1-propanol.

The amines may be at least one mixed solvent selected from among triethyl amine, dibutyl amine, dipropyl amine, butylamine, ethanolamine, diethylenetriamine (DETA), triethylenetetramine (TETA), triethanolamine, 2-aminoethyl piperazine, 2-hydroxyethyl piperazine, dibutylamine, and tris(2-aminoethyl)amine.

The thiols may be at least one mixed solvent selected from among 1,2-ethanedithiol, pentanethiol, hexanethiol, and mercaptoethanol.

The alkanes may be at least one mixed solvent selected from among hexane, heptane, and octane.

The aromatics may be at least one mixed solvent selected from among toluene, xylene, nitrobenzene, and pyridine.

The organic halides may be at least one mixed solvent selected from among chloroform, methylene chloride, tetrachloromethane, dichloroethane, and chlorobenzene.

The nitriles may be acetonitrile.

The ketones may be at least one mixed solvent selected from among acetone, cyclohexanone, cyclopentanone, and acetyl acetone.

The ethers may be at least one mixed solvent selected from among ethyl ether, tetrahydrofuran, and 1,4-dioxane.

The sulfoxides may be at least one mixed solvent selected from among dimethyl sulfoxide (DMSO) and sulfolane.

The amides may be at least one mixed solvent selected from among dimethyl formamide (DMF) and n-methyl-2-pyrrolidone (NMP).

The esters may be at least one mixed solvent selected from among ethyl lactate, γ-butyrolactone, and ethyl acetoacetate.

The carboxylic acids may be at least one mixed solvent selected from among propionic acid, hexanoic acid, meso-2,3-dimercaptosuccinic acid, thiolactic acid, and thioglycolic acid.

However, the solvents are only given as an example, and embodiments of the present invention are not limited thereto.

In some cases, in preparation of the ink, the ink may be manufactured by further adding an additive.

The additive may, for example, be at least one selected from the group consisting of a dispersant, a surfactant, a polymer, a binder, a crosslinking agent, an emulsifying agent, an anti-forming agent, a drying agent, a filler, a bulking agent, a thickening agent, a film conditioning agent, an antioxidant, a fluidizer, a leveling agent, and a corrosion inhibitor. In particular, the additive may be at least one selected from the group consisting of polyvinylpyrrolidone (PVP), polyvinylalcohol, Anti-terra 204, Anti-terra 205, ethyl cellulose, and DispersBYK110.

A method of forming a coating layer by coating the ink may, for example, be any one selected from the group consisting of wet coating, spray coating, spin-coating, doctor blade coating, contact printing, top feed reverse printing, bottom feed reverse printing, nozzle feed reverse printing, gravure printing, micro gravure printing, reverse micro gravure printing, roller coating, slot die coating, capillary coating, inkjet-printing, jet deposition, and spray deposition.

The heat treatment of step (iii) may be carried out at a temperature of 350 to 900□.

Meanwhile, a selenization process may be included to prepare a solar cell thin film having much higher density. The selenization process may be carried out through a variety of methods.

As a first example, effects obtained from the selenization process may be achieved by manufacturing an ink by dispersing S and/or Se in particle types in a solvent with metal chalcogenide nanoparticles or a metal chalcogenide nano particle mixture in step (i), and by combining the heat treatment of step (iii).

As a second example, effects obtained from the selenization process may be achieved through the heat treatment of step (iii) in the presence of S or Se In particular, S or Se may be present by supplying $H_2S$ or $H_2Se$ in a gaseous state or supplying Se or S in a gaseous state through heating.

As a third example, after step (ii), S or Se may be stacked on the coated base, following by performing step (iii). In particular, the stacking process may be performed by a solution process or a deposition method The present invention also provides a thin film manufactured using the above-described method.

The thin film may have a thickness of 0.5 μm to 3.0 μm, more particularly 0.5 μm to 2.5 μm When the thickness of the thin film is less than 0.5 μm, the density and amount of the light absorption layer are insufficient and thus desired photoelectric efficiency may not be obtained. On the other hand, when the thickness of the thin film exceeds 3.0 μm, movement distances of carriers increase and, accordingly, there is an increased probability of recombination, which results in reduced efficiency.

The present invention also provides a thin film solar cell manufactured using the thin film.

A method of manufacturing a thin film solar cell is known in the art and thus a detailed description thereof will be omitted herein.

BRIEF DESCRIPTION OF THE DRAWINGS

The above and other objects, features and other advantages of the present invention will be more clearly understood from the following detailed description taken in conjunction with the accompanying drawing, in which:

FIGS. 1A-1C are scanning electron microscope (SEM) images of CuS nanoparticles formed according to Manufacturing Example 13;

FIGS. 6A-6D are transmission electron microscope (TEM, TEM-EDX) analysis images of CuS—ZnS core-shell nanoparticles formed according to Manufacturing Example 17;

FIGS. 7A-7C are scanning electron microscope (SEM) images of CuS≤ZnS—SnS core-shell nanoparticles formed according to Example 2;

BEST MODE

Figure 2:
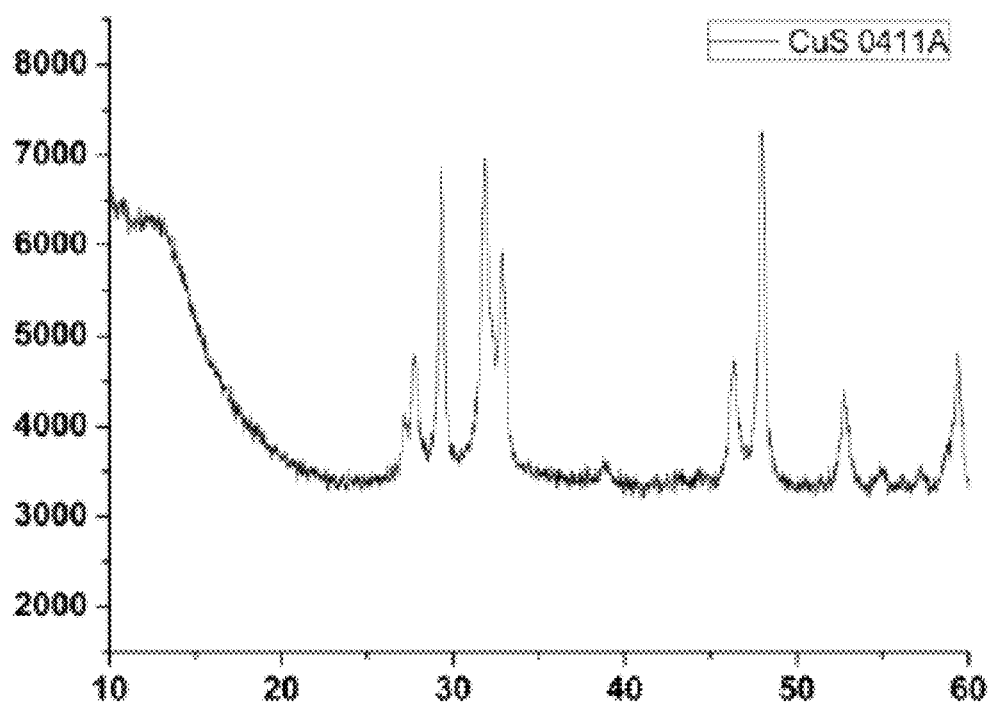
FIG. 2 is an X-ray diffraction (XRD) graph of CuS nanoparticles formed according to Manufacturing Example 13.

Now, the present invention will be described in more detail with reference to the following examples. These examples are provided only for illustration of the present invention and should not be construed as limiting the scope and spirit of the present invention.

MANUFACTURING EXAMPLE 1

Synthesis of CuS Particles

To 150 mL of an aqueous solution including 5 mmol $Na_2S$, 100 mL of an aqueous solution including 5 mmol of $Cu(NO_3)_2$ was added dropwise. Subsequently, the solution was reacted while stirring for 2 hours. Formed particles were purified through centrifugation, resulting in CuS nanoparticles.

MANUFACTURING EXAMPLE 2

Synthesis of CuS Particles 200 mL of an aqueous solution including 5 mmol of $Cu(NO_3)_2$ and 10 mmol of thioacetamide was heated to 80° C. or more while stirring. Maintaining the temperature, the solution was reacted while stirring for 3 hours. Formed particles were purified through centrifugation, resulting in CuS nanoparticles.

MANUFACTURING EXAMPLE 3

Synthesis of CuS Particles 60 mL of an aqueous solution including 5 mmol of $CuCl_2$ was heated to 80□ or more. Subsequently, 60 mL of an aqueous solution including 10 mmol of thioacetamide was slowly added thereto and then was reacted while stirring for 3 hours. Formed particles were purified through centrifugation, resulting in CuS nanoparticles.

MANUFACTURING EXAMPLE 4

Synthesis of CuS Particles 60 ml of a diethylene glycol (DEG) solution including 5 mmol of $Cu(NO_3)_2$ was heated to 60□ or more. Subsequently, 60 ml of a DEG solution including 10 mmol of thioacetamide was added dropwise and then was reacted while stirring for 1 hour at 60□. Formed particles were purified through centrifugation, resulting in CuS nanoparticles.

MANUFACTURING EXAMPLE 5

Synthesis of CuS Particles 300 ml of a DEG solution including 5 mmol of $Cu(NO_3)_2$ was heated to 120□. Subsequently, 100 mL of a DEG solution including 10 mmol of thioacetamide was added dropwise and then was reacted while stirring for 3 hours at 120□. Formed particles were purified through centrifugation, resulting in CuS nanoparticles.

MANUFACTURING EXAMPLE 6

Synthesis of CuS Particles 80 mL of an ethylene glycol (EG) solution including 5 mmol of $Cu(NO_3)_2$ and 10 mmol of thioacetamide was heated to 100□. Subsequently, maintaining the temperature, the solution was reacted while stirring for 3 hours. Formed particles were purified through centrifugation, resulting in CuS nanoparticles.

MANUFACTURING EXAMPLE 7

Synthesis of CuS Particles 200 mL of a DEG solution was heated to 120□ or more and then added dropwise to 50 mL of a DEG solution including 10 mmol of thioacetamide. Subsequently, 50 mL of a DEG solution including 5 mmol of $Cu(NO_3)_2$ was added dropwise thereto. Maintaining the temperature, the solution was reacted while stirring for 3 hours. Formed particles were purified through centrifugation, resulting in CuS nanoparticles.

MANUFACTURING EXAMPLE 8

Synthesis of CuS Particles 250 mL of EG solution including 5 mmol of $Cu(NO_3)_2$ was heated to 170□ or more and then 50 mL of an EG solution including 10 mmol of thioacetamide was added dropwise thereto. Subsequently, maintaining the temperature, the solution was reacted while stirring for 3 hours. Formed particles were purified through centrifugation, resulting in CuS nanoparticles.

MANUFACTURING EXAMPLE 9

Synthesis of CuS Particles 50 mL of a dimethyl sulfoxide (DMSO) solution including 4 mmol of thioacetamide was heated to 60□ or more and then 50 mL of a dimethyl sulfoxide (DMSO) solution including 2 mmol of $Cu(OAc)_2$ was added dropwise. Subsequently, maintaining the temperature, the solution was reacted while stirring for 3 hours. Formed particles were purified through centrifugation, resulting in CuS nanoparticles.

MANUFACTURING EXAMPLE 10

Synthesis of CuS Particles 200 mL of a dimethyl formamide (DMF) solution was heated to 120□ or more and then 50 mL of a DMF solution including 10 mmol of thioacetamide was added dropwise. Subsequently, 50 mL of a DMF solution including 5 mmol of $Cu(NO_3)_2$ was added dropwise and then, maintaining the temperature, the solution was reacted while stirring for 3 hours. Formed particles were purified through centrifugation, resulting in CuS nanoparticles.

MANUFACTURING EXAMPLE 11

Synthesis of CuS Particles 250 mL of an aqueous solution including 5 mmol of $Cu(NO_3)_2$ was heated to 170□ or more and then 50 ml of an EG solution including 10 mmol of thioacetamide was added dropwise. Subsequently, maintaining the temperature, the solution was reacted while stirring for 3 hours. Formed particles were purified through centrifugation, resulting in CuS nanoparticles.

MANUFACTURING EXAMPLE 12

Synthesis of CuS Particles 200 ml of a DEG solution including 3 g of PVP was heated to 120☐ or more and then 50 mL of a DEG solution including 10 mmol of thioacetamide was added dropwise thereto. Subsequently, 50 ml of a DEG solution including 5 mmol of $Cu(NO_3)_2$ was added dropwise and then, maintaining the temperature, the solution was reacted while stirring for 3 hours. Formed particles were purified through centrifugation, resulting in CuS nanoparticles.

MANUFACTURING EXAMPLE 13

Synthesis of CuS Particles 200 mL of a DEG solution including 1 g of dodecylamine was heated to 120☐ or more and then 50 mL of a DEG solution including 10 mmol of thioacetamide was added dropwise thereto. Subsequently, 50 ml of a DEG solution including 5 mmol of $Cu(NO_3)_2$ was added dropwise and then, maintaining the temperature, the solution was reacted while stirring for 3 hours. Formed particles were purified through centrifugation, resulting in CuS nanoparticles. A scanning electron microscope (SEM) image and X-ray diffraction (XRD) graph for the formed particles are illustrated in FIGS. 1 and 2.

MANUFACTURING EXAMPLE 14

Synthesis of CuS Particles

Figure 3A:
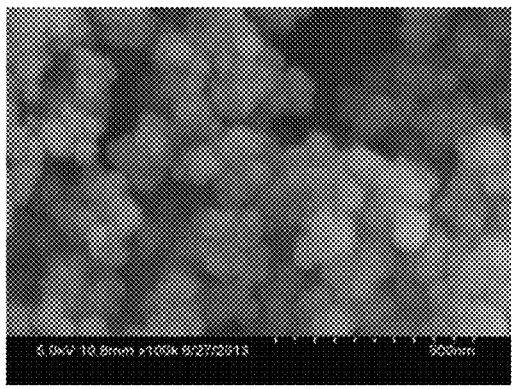
FIGS. 3A-3C are scanning electron microscope (SEM) images of CuS nanoparticles formed according to Manufacturing Example 14.
Figure 3B:
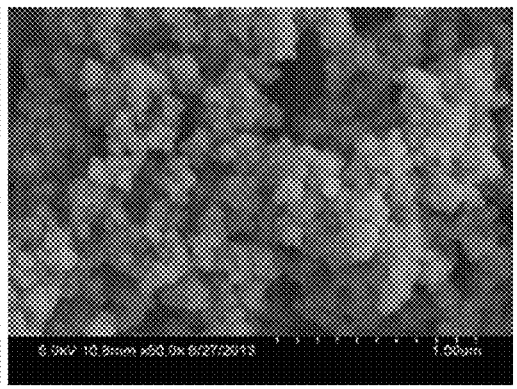
Figure 3C:
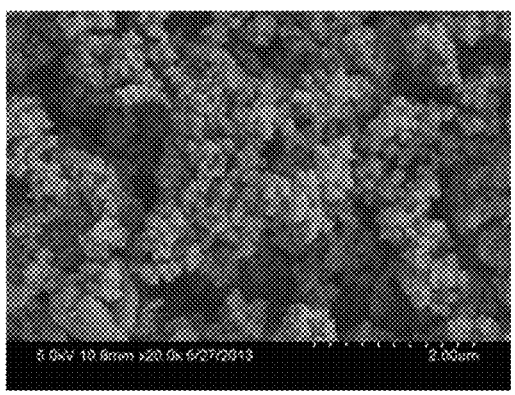
Figure 4:
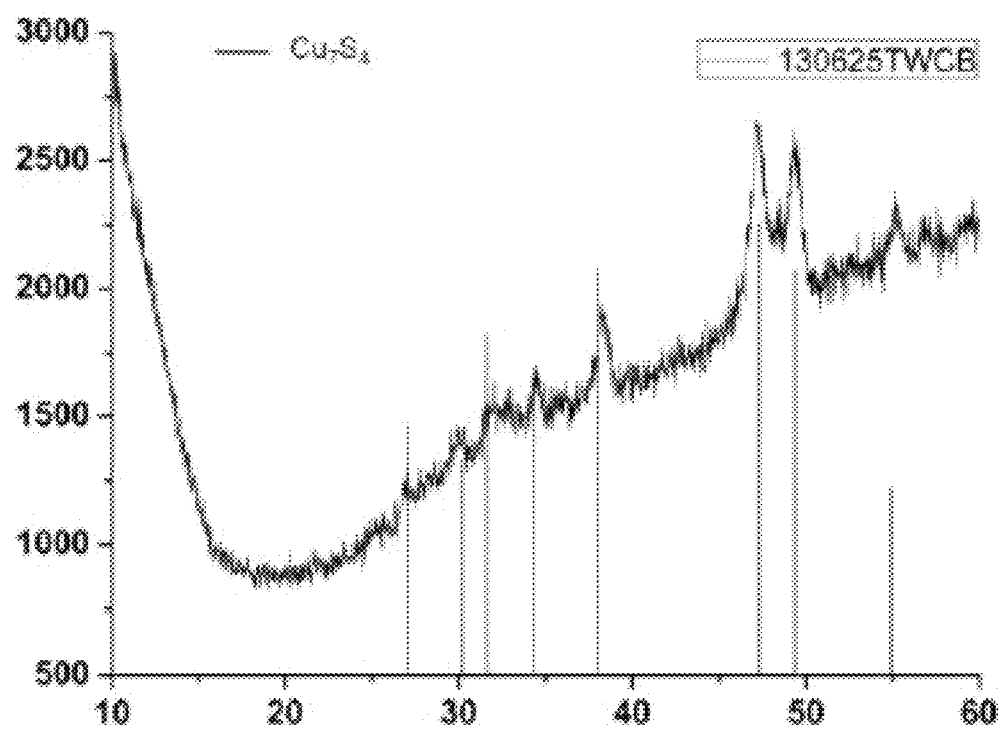
FIG. 4 is an X-ray diffraction (XRD) graph of CuS nanoparticles formed according to Manufacturing Example 14.

To 100 mL of an aqueous solution including 5 mmol of sodium thiosulfate, 100 mL of an aqueous solution including 50 mmol of citric acid was added dropwise and then was heated to 80☐ or more. Subsequently, 50 mL of an aqueous solution including 5 mmol of $Cu(NO_3)_2$ was added dropwise and then, maintaining the temperature, the solution was reacted while stirring for 3 hours. Formed particles were purified through centrifugation, resulting in CuS nanoparticles. A scanning electron microscope (SEM) image and an XRD graph for the formed particles are illustrated in FIGS. 3 and 4.

MANUFACTURING EXAMPLE 15

Synthesis of CuS Particles

To 100 mL of an EG solution including 5 mmol of sodium thiosulfate, 100 mL of an EG solution including 50 mmol of citric acid was added dropwise and the then heated to 80☐ or more. Subsequently, 50 mL of an EG solution including 5 mmol of $Cu(NO_3)_2$ was added dropwise thereto. Subsequently, maintaining the temperature, the solution was reacted while stirring for 3 hours. Formed particles were purified through centrifugation, resulting in CuS nanoparticles.

MANUFACTURING EXAMPLE 16

Synthesis of CuS Particles 100 mL of an EG solution including 5 mmol of thiourea was heated to 80☐ or more and then 100 mL of an EG solution including 5 mmol of $Cu(NO_3)_2$ was added dropwise. Subsequently, maintaining the temperature, the solution was reacted while stirring for 3 hours. Formed particles were purified through centrifugation, resulting in CuS nanoparticles.

MANUFACTURING EXAMPLE 17

Figure 5A:
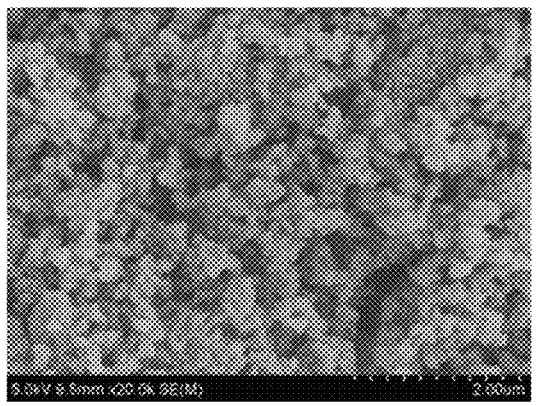
FIGS. 5A-5C are scanning electron microscope (SEM) images of CuS—ZnS core-shell nanoparticles formed according to Manufacturing Example 17.
Figure 5B:
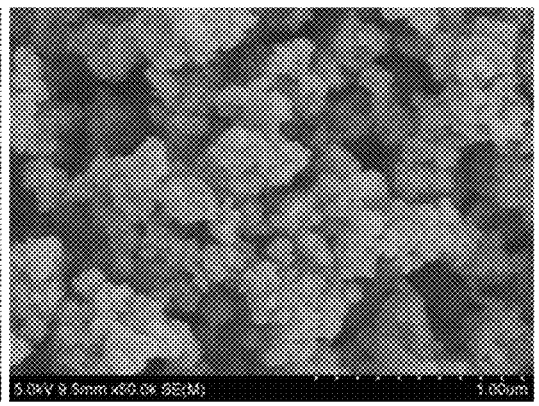
Figure 5C:
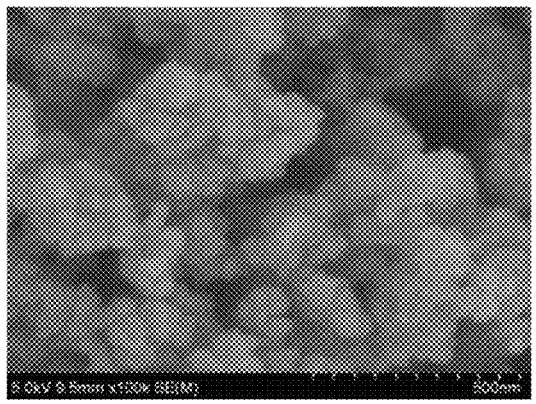
Figure 8:
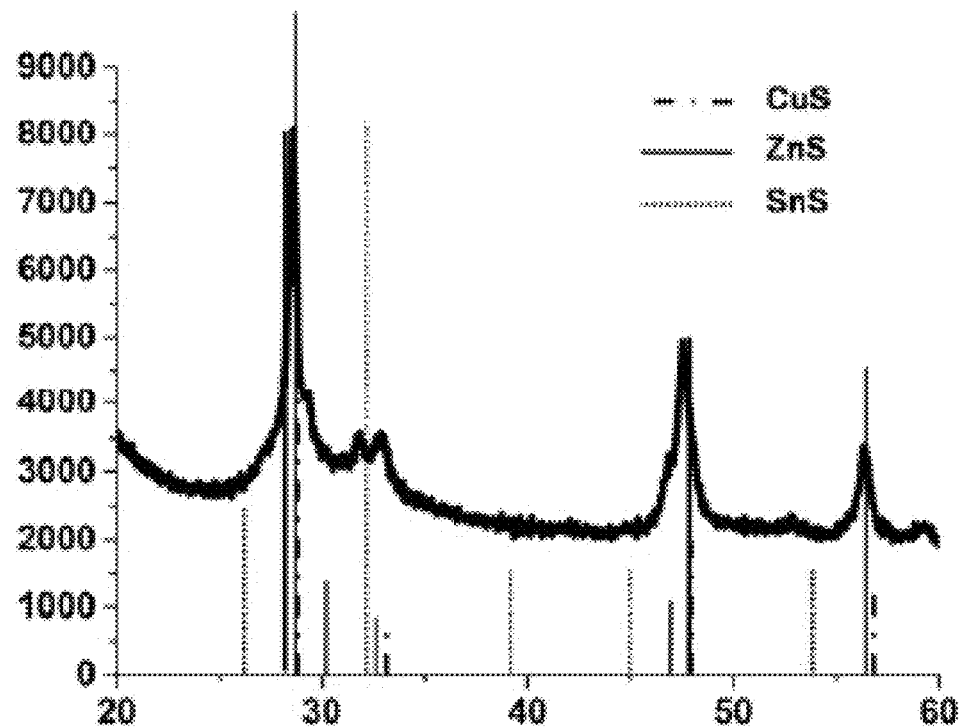
FIG. 8 is an X-ray diffraction (XRD) graph of CuS—ZnS—SnS core-shell nanoparticles formed according to Example 2.
Figure 9A:
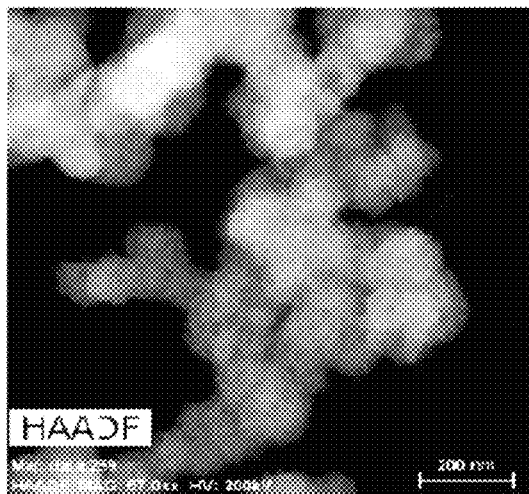
FIGS. 9A-9E are transmission electron microscope (TEM, TEM-EDX) analysis images of CuS—ZnS—SnS core-shell nanoparticles formed according to Example 2.
Figure 9B:
Figure 9C:
Figure 9D:
Figure 9E:
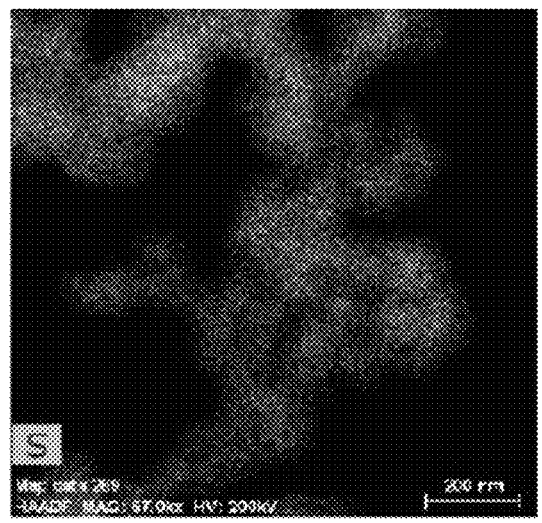
Figure 10A:
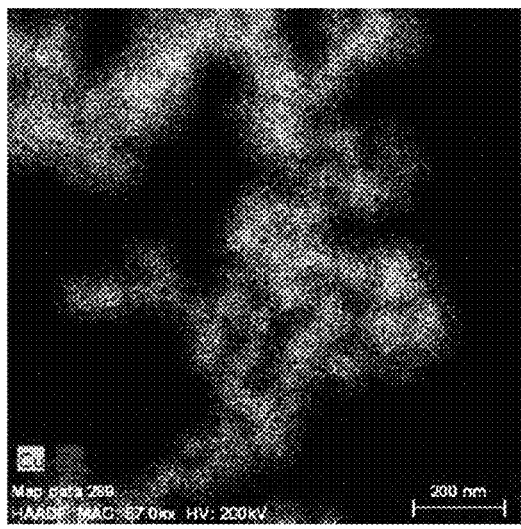
FIGS. 10A-10D are another transmission electron microscope (TEM, TEM-EDX) analysis images of CuS—ZnS—SnS nanoparticles formed according to Example 2.
Figure 10B:
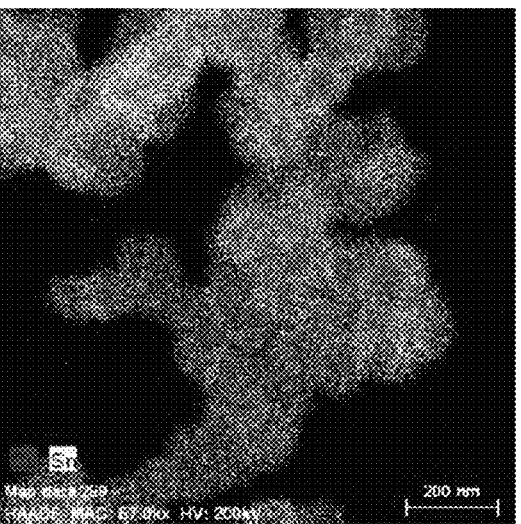
Figure 10C:
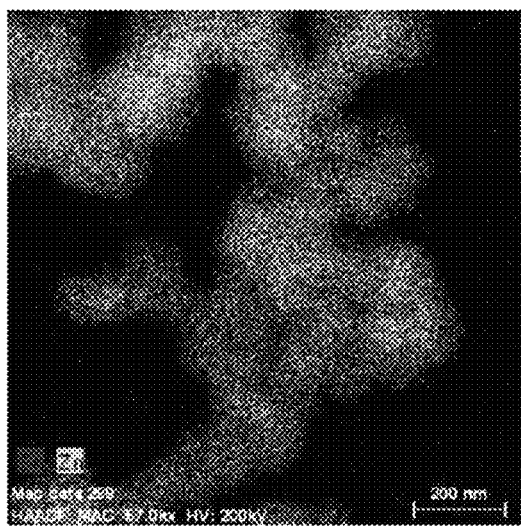
Figure 10D:
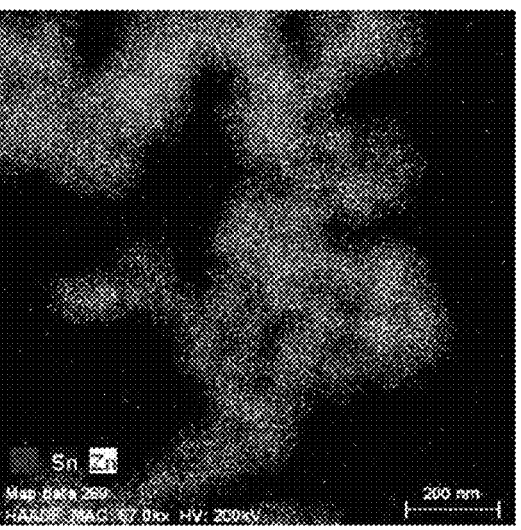

Synthesis of CuS—ZnS Particles 200 mL of a DEG solution including 1 g of dodecylamine was heated to 120☐ or more and then 50 mL of a DEG solution including 10 mmol of thioacetamide was added dropwise thereto. Subsequently, 50 mL of a DEG solution including 5 mmol of $Cu(NO_3)_2$ was added dropwise and then, maintaining the temperature, the solution was reacted while stirring for 3 hours. Formed particles were purified through centrifugation, resulting in CuS nanoparticles. 100 mg of the obtained CuS nanoparticles was redispersed in 100 mL of a DEG solution and then 100 mL of a DEG solution including 10 mmol of thioacetamide and 5 mmol of $ZnCl_2$ was added dropwise. Subsequently, the solution was heated to 120☐ or more and, maintaining the temperature, stirred for 3 hours. Subsequently, the solution was purified through centrifugation to obtain particles. A scanning electron microscope (SEM) image and transmission electron microscope (TEM) image of the obtained particles are illustrated in FIGS. 5 and 6.

EXAMPLE 1

Synthesis of CuS—SnS—ZnS Three-Layer Core-Shell Nanoparticles

CuS core particles according to Manufacturing Example 13 were synthesized. Subsequently, an EG solution including 10 mmol of thioacetamide was added to the particles and then an EG solution including 5 mmol of $SnCl_2$ was slowly added dropwise thereto. Subsequently, temperature was elevated up to 125☐ and then the solution was reacted while stirring for 3 hours. Through the reaction, core-shell structure nanoparticles were formed. Subsequently, CuS—SnS particles were obtained through centrifugation. The obtained CuS—SnS particles were redispersed in DMSO and then a DEG solution including 10 mmol of thioacetamide was added thereto at room temperature. Subsequently, a DEG solution including 6 mmol of $ZnCl_2$ was slowly added dropwise thereto. Subsequently, temperature was elevated up to 130☐ and then the solution was reacted while stirring for 3 hours. Formed particles were purified through centrifugation, resulting in three-layer core-shell structure CuS—SnS—ZnS nanoparticles.

EXAMPLE 2

Synthesis of CuS—ZnS—SnS Three-Layer Core-Shell Nanoparticles

CuS core particles were synthesized according to Manufacturing Example 13. Subsequently, a DEG solution including 10 mmol of thioacetamide was added to the particles at room temperature and then a DEG solution including 6 mmol of $ZnCl_2$ was slowly added dropwise while elevating temperature up to 130☐. Subsequently, the solution was reacted while stirring for 3 hours at 130☐. As a result of the reaction, core-shell structure nanoparticles were formed. The formed core-shell structure nanoparticles were centrifuged to obtain CuS—ZnS particles. The obtained CuS—ZnS particles were redispersed in an EG solution. Subsequently, at room temperature, an EG solution including 10 mmol of thioacetamide was added thereto and then an EG solution including 5 mmol of SnCl$_2$ was slowly added dropwise thereto. Subsequently, temperature was elevated up to 125□ and then the solution was reacted while stirring for 3 hours. Formed particles were purified through centrifugation, resulting in three-layer core-shell structure CuS—ZnS—SnS nanoparticles. A scanning electron microscope (SEM) image, XRD graph and transmission electron microscope image (TEM) of the formed particles are illustrated in FIGS. 7 to 10.

EXAMPLE 3

Manufacture of Thin Film

Figure 11:
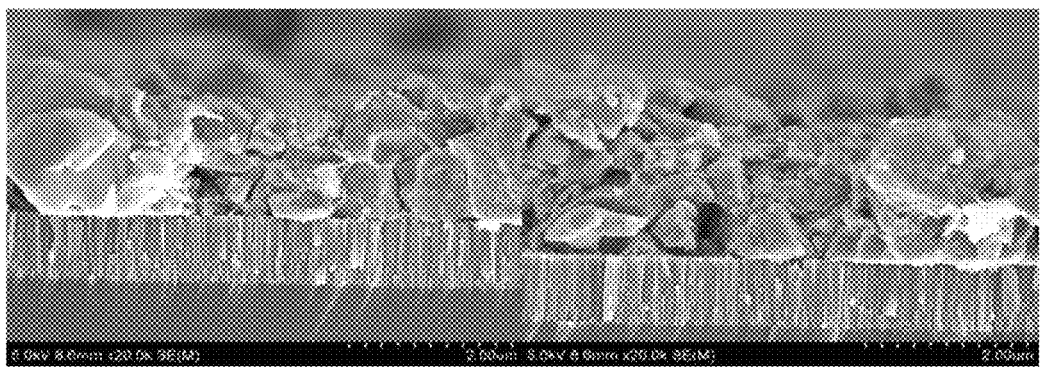
FIG. 11 is a scanning electron microscope (SEM) image of a CZTSSe thin film manufactured according to Example 3.

Nanoparticles synthesized according to Example 19 were dispersed in a mix solvent including an alcohol based solvent to manufacture an ink. The ink was coated a glass substrate on coated with molybdenum (Mo). After drying the coating layer, the substrate was heated with a glass substrate deposited with Se to provide Se atmosphere at 575° C. such that rapid thermal annealing (RTA) is performed. As a result, a CZTSSe based thin film was manufactured. A scanning electron microscope (SEM) image of the obtained thin film is illustrated in FIG. 11.

As can be seem from the above results, a CZTS solar cell may be manufactured using three-layer core-shell structure particles described in the present invention as a precursor. When a thin film is manufactured using the three-layer core-shell structure particles as a precursor, all of the essential elements of CZTS are present in several hundred nanometer microscopic areas and the elements exist in a desired ratio. Therefore, a superior quality film may be provided even through a short RTA process and the entire composition of the thin film may be uniform, and, accordingly, electrons may easily move. As a result, a solar cell having entirely improved photo conversion efficiency may be manufactured.

Those skilled in the art will appreciate that various modifications, additions and substitutions are possible, without departing from the scope and spirit of the invention as disclosed in the accompanying claims.

INDUSTRIAL APPLICABILITY

As described above, according to the present invention, by manufacturing three-layer core-shell structure nanoparticles including a core including a copper (Cu)-containing chalcogenide, and, as tin (Sn)-containing chalcogenides, (i) a first shell including a tin (Sn)-containing chalcogenide and a second shell including a zinc (Zn)-containing chalcogenide; or (ii) a first shell including a zinc (Zn)-containing chalcogenide and a second shell including a tin (Sn)-containing chalcogenide, process costs may be reduced and stable processes are possible, and, as such, productivity may be increased.

In addition, the three-layer core-shell structure nanoparticles are stable against oxidation and have high reactivity. Thus, when a thin film is manufactured using the three-layer core-shell structure nanoparticles, a superior quality film may be provided. In addition, since one particle includes all of Cu, Sn, Zn, and S or Se, an entire composition of a thin film may be uniform. As a result, photoelectric efficiency of a solar cell according to the present invention is increased.

The invention claimed is:

1. Three-layer core-shell structure nanoparticles forming a light absorption layer of solar cells comprising a core comprising a copper (Cu)-containing chalcogenide, and a first shell comprising a tin (Sn)-containing chalcogenide and a second shell comprising a zinc (Zn)-containing chalcogenide; or a first shell comprising a zinc (Zn)-containing chalcogenide and a second shell comprising a tin (Sn)-containing chalcogenide.

2. The three-layer core-shell structure nanoparticles according to claim 1, wherein the core has a diameter of 20 nanometers to 200 nanometers.

3. The three-layer core-shell structure nanoparticles according to claim 1, wherein a weight of the zinc (Zn)-containing chalcogenide comprised in the first shell or second shell is 35 parts by weight to 100 parts by weight based on 100 parts by weight of the copper (Cu)-containing chalcogenide comprised in the core.

4. The three-layer core-shell structure nanoparticles according to claim 1, wherein a weight of the tin (Sn)-containing chalcogenide comprised in the first shell or second shell is 40 parts by weight to 65 parts by weight based on 100 parts by weight of the copper (Cu)-containing chalcogenide comprised in the core.

5. The three-layer core-shell structure nanoparticles according to claim 1, wherein the copper (Cu)-containing chalcogenide is at least one selected from the group consisting of CuS, Cu$_x$S wherein 1.7≤x≤2.0, CuSe, and Cu$_y$Se wherein 1.7≤y≤2.0.

6. The three-layer core-shell structure nanoparticles according to claim 1, wherein the tin (Sn)-containing chalcogenide is SnS, and/or SnSe.

7. The three-layer core-shell structure nanoparticles according to claim 1, wherein the zinc (Zn)-containing chalcogenide is ZnS, and/or ZnSe.

8. A method of synthesizing the three-layer core-shell structure nanoparticles according to claim 1, the method comprising:

preparing a first solution comprising at least one Group VI source selected from the group consisting of compounds comprising sulfur (S), or selenium (Se), or sulfur (S) and selenium (Se);

preparing a second solution comprising a copper (Cu) salt, a third solution comprising a tin (Sn) salt and a fourth solution comprising a zinc (Zn) salt;

manufacturing and reacting a mixture by mixing the first solution and second solution to synthesize copper (Cu)-containing chalcogenide core particles;

mixing the third solution or fourth solution with a product comprising the core particles of the manufacturing and reacting to form a first shell; and purifying after forming a second shell by mixing the fourth solution or third solution not comprised in the mixing with a product comprising the core-shell structure nanoparticles comprising the first shell of the mixing to synthesis the three-layer core-shell structure nanoparticles .

9. The method according to claim 8, wherein solvents of the first solution to fourth solution are at least one selected from the group consisting of water, methanol, ethanol, glycol class solvents, oleylamine, dimethyl sulfoxide and dimethyl formamide.

10. The method according to claim 9, wherein the glycol class solvents are at least one selected from the group consisting of ethyleneglycol, diethylene glycol, NMP, diethylene glycol mono ethyl ether (DEGMEE) and triethylene glycol.

11. The method according to claim 8, wherein the salts are at least one selected from the group consisting of chlorides, nitrates, nitrites, sulfates, acetates, sulfites, acetylacetoantes and hydroxides.

12. The method according to claim 8, wherein the Group VI source is at least one selected from the group consisting of Se, $Na_2Se$, $K_2Se$, $Ca_2Se$, $(CH_3)_2Se$, $SeO_2$, $SeCl_4$, $H_2SeO_3$, $Na_2S$, $K_2S$, $Ca_2S$, $(CH_3)_2S$, $H_2SO_4$, S, $Na_2S_2O_3$, $NH_2SO_3H$ and hydrates thereof.

13. The method according to claim 8, wherein the Group VI source is at least one selected from the group consisting of thiourea, thioacetamide and selenourea.

14. The method according to claim 8, wherein the Group VI source in the mixture of the manufacturing and reacting is comprised to 0.5 mol to 4 mol based on 1 mol of the copper (Cu) salt.

15. The method according to claim 8, wherein a concentration of the tin (Sn) salt in the third solution is determined such that a molar ratio of tin (Sn)/copper (Cu) is in a range of 0.5 to 3.

16. The method according to claim 8, wherein a concentration of the zinc (Zn) salt in the fourth solution is determined such that a molar ratio of zinc (Zn)/copper (Cu) is in a range of 0.6 to 3.

17. The method according to claim 8, wherein, when the first shell is formed in a product comprising the core particles of the mixing or the second shell is formed in a product comprising the core-shell structure nanoparticles comprising the first shell of the purifying, the Group VI source is further added.

18. A method of manufacturing a thin film comprising a light absorption layer based on the three-layer core-shell structure nanoparticles according to claim 8, the method comprising:
dispersing three-layer core-shell structure nanoparticles in a solvent to manufacture an ink composition;
coating the ink composition on a base provided with an electrode; and
drying and heat-treating the ink composition coated on the base provided with an electrode.

19. The method according to claim 18, wherein the solvent of the dispersing is at least one organic solvent selected from the group consisting of alkanes, alkenes, alkynes, aromatics, ketones, nitriles, ethers, esters, organic halides, alcohols, amines, thiols, carboxylic acids, phosphines, phosphates, sulfoxides, and amides.

20. The method according to claim 18, the ink composition of the dispersing is manufactured by further adding an additive, wherein the additive is at least one selected from the group consisting of polyvinylpyrrolidone (PVP), polyvinyl alcohol, Anti-terra 204, Anti-terra 205, ethyl cellulose, and DispersBYK110.

* * * * *